(12) United States Patent
Pham et al.

(10) Patent No.: US 11,388,830 B2
(45) Date of Patent: Jul. 12, 2022

(54) LIFT AND ROTATING DRIVE CAGE

(71) Applicant: HEWLETT PACKARD ENTERPRISE DEVELOPMENT LP, Houston, TX (US)

(72) Inventors: Kenny H. Pham, Houston, TX (US); Minh H. Nguyen, Katy, TX (US); Earl W. Moore, Cypress, TX (US); Keith Sauer, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 189 days.

(21) Appl. No.: 16/418,228

(22) Filed: May 21, 2019

(65) Prior Publication Data

US 2020/0375054 A1 Nov. 26, 2020

(51) Int. Cl.
*H05K 7/14* (2006.01)
*G06F 1/18* (2006.01)
*H05K 7/18* (2006.01)

(52) U.S. Cl.
CPC .......... *H05K 7/1411* (2013.01); *G06F 1/181* (2013.01); *G06F 1/187* (2013.01); *H05K 7/1488* (2013.01); *H05K 7/18* (2013.01)

(58) Field of Classification Search
CPC ...... H05K 7/1411; H05K 7/1488; H05K 7/18; G06F 1/181; G06F 1/187
See application file for complete search history.

(56) References Cited

U.S. PATENT DOCUMENTS

| | | | |
|---|---|---|---|
| 6,061,966 A * | 5/2000 | Nelson | E05C 17/14 49/394 |
| 6,392,875 B1 | 5/2002 | Erickson et al. | |
| 6,445,576 B1 | 9/2002 | Wooden et al. | |
| 7,012,803 B1 | 3/2006 | Austin et al. | |
| 8,054,620 B2 | 11/2011 | Roesner et al. | |
| 9,152,170 B2 * | 10/2015 | Zhu | G06F 1/187 |
| 9,380,722 B2 | 6/2016 | Junkins et al. | |
| 9,699,931 B1 * | 7/2017 | Chen | H05K 7/1489 |
| 9,911,464 B2 | 3/2018 | Jau et al. | |
| 10,031,561 B1 * | 7/2018 | Strickland | H05K 7/1489 |
| 10,192,589 B2 * | 1/2019 | Chen | G06F 1/18 |
| 10,324,504 B2 * | 6/2019 | Strickland | H05K 7/1489 |

(Continued)

OTHER PUBLICATIONS

IBM, "SAS HDD Backplane Removal Movie—IBM System x3650 M2 (7947), x3650 M3 (7376, 7945)," Sep. 30, 2010, https://www.-01.ibm.com/support/docview.wss?uid=ibm1MIGR-5082270.

*Primary Examiner* — Rockshana D Chowdhury
*Assistant Examiner* — Douglas R Burtner
(74) *Attorney, Agent, or Firm* — Nolte Intellectual Property Law Group

(57) ABSTRACT

An apparatus includes: a 1 U drive chassis divided into a plurality of compartments by a partition, the plurality of compartments including an interior compartment; an interior cage installed in the interior compartment, the interior cage including a plurality of pockets into which storage media are mounted when in use and having a back edge; a hinge by which the interior cage is rotatably mounted to the 1 U drive chassis along the back edge of the interior cage; a lift to rotate the interior cage at least partially to an open position when the first latch is released; and a latch to maintain the interior cage in a closed position and to maintain the interior cage in the opened position according to the rotation of the interior compartment.

15 Claims, 13 Drawing Sheets

(56) References Cited

U.S. PATENT DOCUMENTS

| | | | | |
|---|---|---|---|---|
| 10,383,249 B1* | 8/2019 | Peng | ............... | H05K 7/20736 |
| 11,197,387 B2* | 12/2021 | Liu | ................... | G11B 33/124 |
| 2013/0070422 A1* | 3/2013 | Dunham | ............ | G11B 33/124 |
| | | | | 312/319.1 |
| 2015/0201520 A1* | 7/2015 | Jau | ................... | G11B 33/124 |
| | | | | 211/26 |
| 2015/0355686 A1* | 12/2015 | Heyd | ................ | G11B 33/128 |
| | | | | 361/679.31 |
| 2016/0073544 A1* | 3/2016 | Heyd | ..................... | G06F 1/20 |
| | | | | 361/679.31 |
| 2019/0269025 A1* | 8/2019 | Sassano | ............ | H05K 5/0217 |
| 2020/0396859 A1* | 12/2020 | Liu | .................. | H05K 7/1489 |

* cited by examiner

LIFT AND ROTATING DRIVE CAGE

BACKGROUND

In the computing arts, it is common to mount or install several storage media in a chassis. The art frequently measures some dimensions of chassis and racks in a unit of measure called "U". "U" is a standard unit of measure and determines how many chassis can fit in a given rack. A 1 U chassis is dimensioned and designed to be inserted into a 1 U rack space—i.e., a rack space designed to hold a single chassis. There are also larger chassis and racks, for instance 2 U and up.

BRIEF DESCRIPTION OF THE DRAWINGS

The invention may be understood by reference to the following description taken in conjunction with the accompanying drawings, in which like reference numerals identify like elements, and in which.

Figure 1:
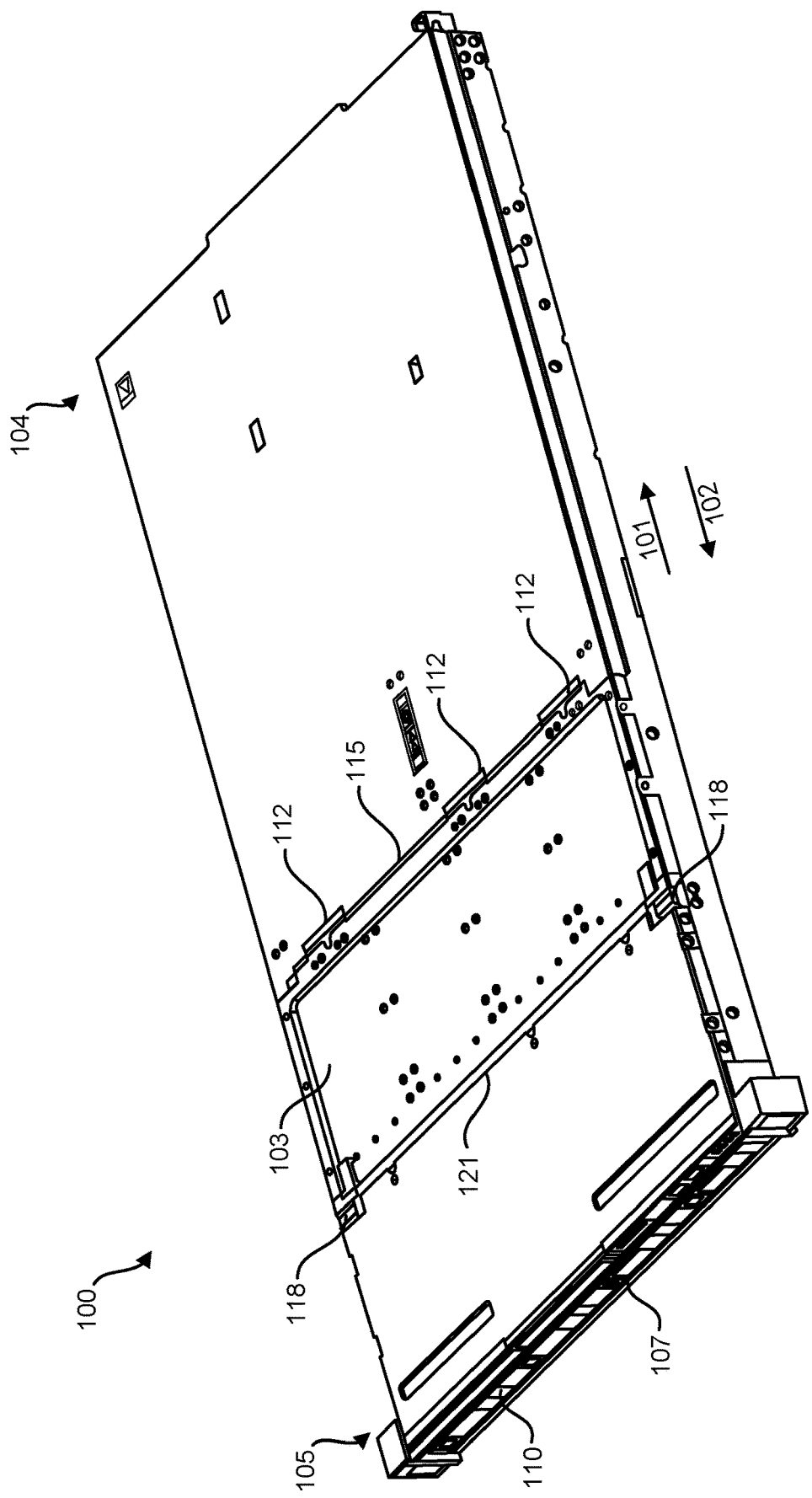
FIG. 1 depicts a 1 U chassis including installed cages in which an interior cage is rotated into a closed position in an elevational view of one example of the subject matter claimed below.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the having the benefit of this disclosure.

Increasing performance demands has led to higher densities of computing resources in larger computing systems. For instance, storage resources might include chassis in which storage media such as hard disk drives ("HDD") or solid-state drives ("SDD") are installed in a carrier before being placed into a rack. The push for higher densities mitigates for more storage media to be mounted in a given chassis. However, it also desirable to have ready access to the storage media so they can be replaced or repaired without taking the entire chassis or rack out of operation for extended periods of time.

Because of the large investment represented by existing, large computing systems, this higher density should be achieved within the context, of existing hardware. This is difficult in a 1 U rack space because of size and space constraints imposed by the 1 U chassis. Storage media in 1 U chassis are accessed through the face of the chassis, which cannot be enlarged without violating the 1 U standard dimensions. Cabling for the storage media is routed through the chassis and complicates space requirements for the storage media given the 1 U size and dimensional limitations.

This disclosure provides a rotating cage and a lift for use in a 1 U chassis. The 1 U form factor imposes severe space constraints when installing, or mounting multiple storage media. This is especially true with respect to accessing the storage media that, are not located on the edge and are not accessible through the front or rear faces of the 1 U chassis. The rotating cage and lift provide accessibility to storage media mounted in the interior of the chassis in a manner that will meet 1 U size and dimension constraints.

The 1 U chassis is divided into a plurality of compartments by partitions. Some of the compartments may be accessible through a face of the chassis, and are "edge compartments". Some of these compartments are not accessible through a face and are "interior compartments". Storage media mounted or installed in an edge compartment are mounted or installed in an edge cage and storage media mounted or installed in an interior compartment are mounted or installed in an interior cage. To permit access to the interior cage, the interior cage is mounted by a hinge along its back edge to one of the partitions so that the interior cage can rotate out of the interior compartment to an open position.

A lift provides the motive force for the rotation. When released, the lift at least partially rotates the interior cage out of the interior compartment. Different kinds of lifts may be used in different examples and two lifts are disclosed herein. The first lift is a biasing member (e.g., a spring) mounted between the interior cage and the floor of the chassis. When released by a latch, the biasing member rotates the interior cage from the interior compartment into an open position. In the fully open position, the interior cage is held by a latch until the latch is released. The second is a lever that, when released by a latch, may be raised by a user. As the lever is raised, it interacts with a cam to fully open the interior cage to the open position whereupon a second latch holds the interior cage open until released.

More particularly, in some examples, an apparatus includes: a 1 U drive chassis divided into a plurality of compartments by a partition, the plurality of compartments including an interior compartment; an interior cage installed in the interior compartment, the interior cage including a plurality of pockets into which storage media are mounted when in use and having a back edge; a hinge by which the interior cage is rotatably mounted to the 1 U drive chassis along the back edge of the interior cage; a lift to rotate the interior cage at least partially to an open position when the first latch is released; and a latch to maintain the interior cage in a closed position and to maintain the interior cage in the opened position according to the rotation of the interior compartment.

In other examples, a method for installing a device cage in a 1 U chassis, includes: partitioning a 1 U chassis into a plurality of compartments, the plurality of compartments including an interior compartment; installing an interior cage in the interior compartment, the interior cage being rotatably mounted to a partition by a hinge and latched into a closed position; releasing a latch to permit upward rotation of the interior cage; rotating the interior cage to an open position; and latching the interior cage in the open position.

Figure 2:
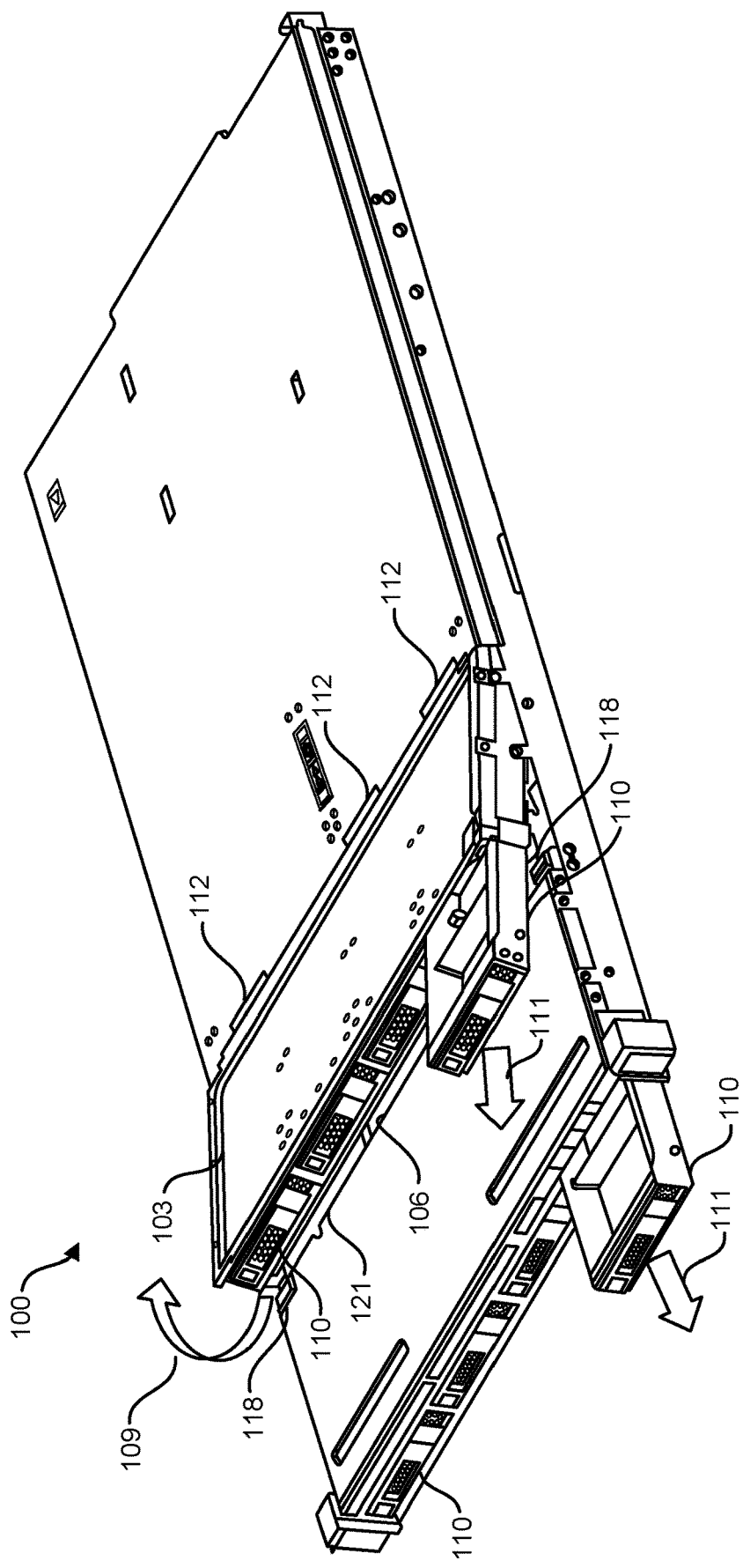
FIG. 2 depicts the 1 U chassis of FIG. 1 with the interior cage rotated into an open position.

Turning now to the drawings, FIG. 1 and FIG. 2 depict a 1 U chassis 100 including an interior cage 103 in elevational views. The 1 U chassis 100 is designed to be inserted into a 1 U rack space in the direction of the arrow 101 in FIG. 1. In this disclosure, the terms "front", "forward", "rearward" and "rear" will be determined relative to the direction of insertion. The direction 101 is therefore a rearward direction and the direction 102 is a forward direction in this disclosure. The 1 U chassis 100 is therefore inserted into the rack rear end 104 first, leaving the front face 107 on the front end 105 accessible.

FIG. 1 shows the 1 U chassis 100 with the interior cage 103 in a closed position. FIG. 2 shows the 1 U chassis 100 with the interior cage 103 rotated into an open position. The interior cage 103 rotates into and out of an interior compartment 106, shown in FIG. 2, as indicated by the arrow 109. When the interior cage 103 is in the open position shown in FIG. 2, the storage media 110 mounted or installed in the interior cage 103 may be accessed and/or removed as indicated by the arrow 111.

The rotation occurs around a plurality of hinges 112. The number of hinges 112 will be implementation specific and, although three are shown, the number may be more or less than three. The number could be as few as one in some examples, for instance. In general, the more hinges 112 used, the shorter they may be. A single hinge, for instance, may need to extend along substantially all of the back edge 115 of the interior cage 103. The hinges 112 are positioned along the back edge 115 of the interior cage 103 rather than on the sides thereof. The hinges 112 are, in this particular example, leaf hinges, but other types of hinges may be used in other examples.

Figure 3:
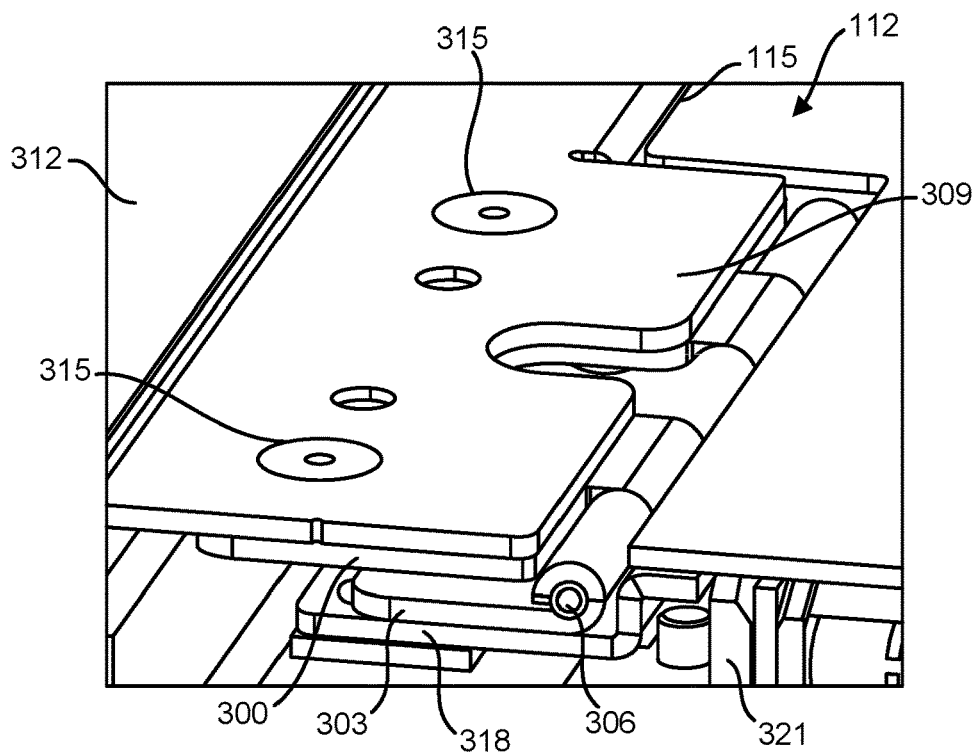
FIG. 3 shows a hinge from FIG. 1 in a closed position in an elevational, partially sectioned view.
Figure 4:
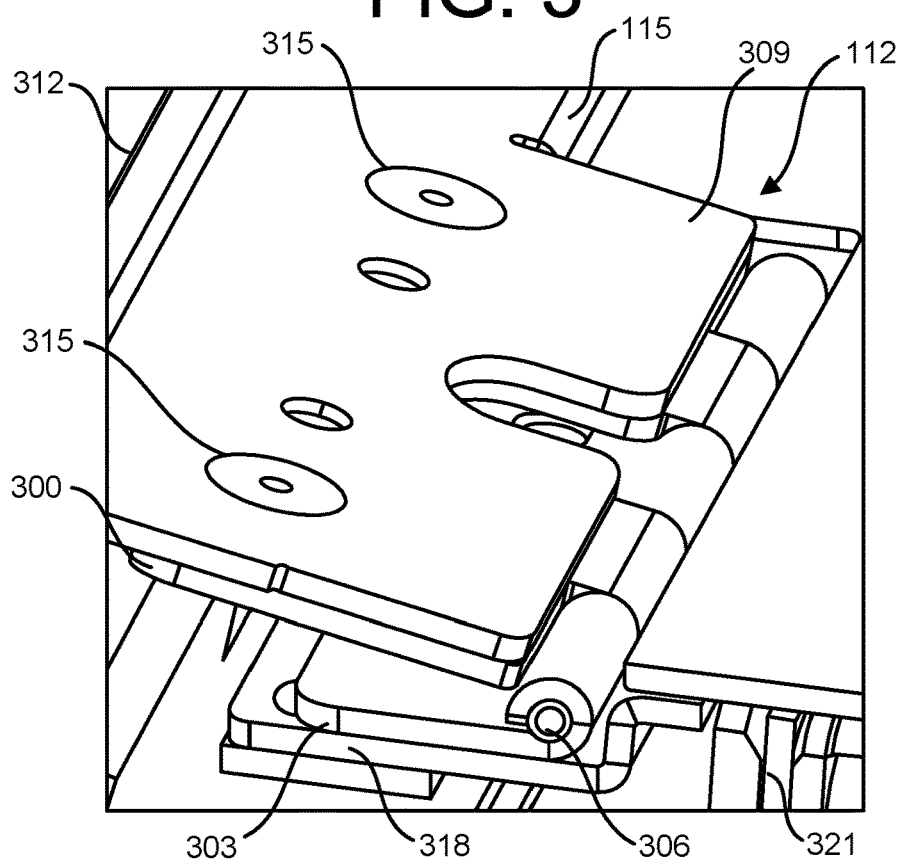
FIG. 4 shows a hinge from FIG. 1 in an open position in an elevational, partially sectioned view.

FIG. 3 and FIG. 4 show one of the hinges 112 in greater detail. More particularly FIG. 3 shows the hinge 112 in a closed position and FIG. 4 shows the hinge 112 in an open position, both in elevational, partially sectioned views. The hinge 112 includes a first leaf 300, a second leaf 303, and a pivot 306. The first leaf 300 is affixed to the back edge 115 of the interior cage 103 by a flange 309 of a top cover 312 for the interior cage 103 by fasteners 315. The second leaf 303 is affixed to a flange 318 of the partition 321 by a plurality of fasteners (not shown). The fasteners 315 may be, for instance, brad, pins, screws, etc.

The partition 321 is affixed to the floor (not shown) of the 1 U chassis 100. The first leaf 300 then rotates around the pivot 306 relative to the second leaf 303 as the interior cage 103 is rotated into the open position. Referring again collectively to FIG. 1-FIG. 2, each of the hinges 112 shown in FIG. 1-FIG. 2 are constructed and operate similarly. Thus, the interior cage 103 is rotatably mounted to the 1 U chassis 100 through the hinges 112.

Other examples not shown may use hinging mechanisms alternative to the leaf hinges by which the hinges 112 are implemented in the example of FIG. 1-FIG. 4. The leaf hinges by which the hinges 112 are, by way of example and illustration, but one, means by which the rotation of the interior cage 103 relative to the 1 U chassis 100 may be effected. Alternative examples may employ other means having equivalent structure that perform the same function. Still other examples may use other hinging mechanisms that do not have equivalent structure or that perform the same or similar function in a somewhat different way.

Figure 5:
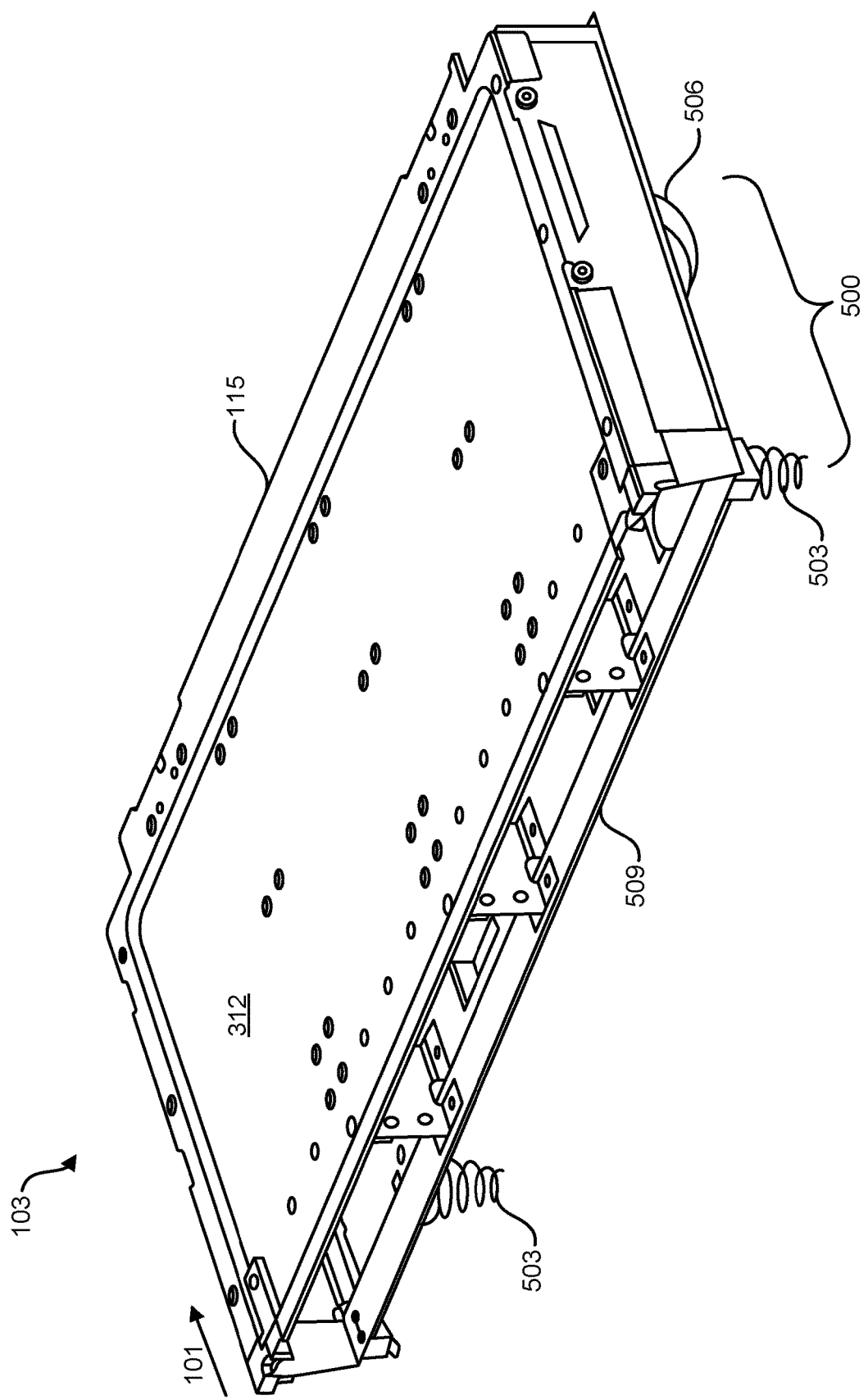
FIG. 5 depicts the interior cage of FIG. 1-FIG. 2 disassembled from the 1 U chassis without any storage media mounted or installed in a front elevational view.

The motive force for the rotation into the open position is provided by a lift 500, best shown in FIG. 5. FIG. 5 depicts the interior cage 103 disassembled from the 1 U chassis 100 and without any storage media 110 (shown in FIG. 1-FIG. 2) mounted or installed in a front elevational view. In this example, the lift 500 includes a pair of coil springs 503 and a pair of leaf springs 506, only one of which is shown in FIG. 5. The coil springs 503 and leaf springs 506 are affixed to the bottom 509 of the interior cage 103. The terms "top" and "bottom" as used herein are defined relative to, the orientation of the interior cage 103 in its natural and intended position when installed in the 1 U chassis 100 and the 1 U chassis 100 is mounted in a rack (not shown).

Some examples not shown may use only one or the other of the coil springs 503 and leaf springs 506 to the exclusion of the other. Still other examples may use other kinds of springs and still others may use other kinds of lift altogether. Accordingly, other examples not shown may use lifts alternative to that shown in the example of FIG. 5. The coil springs 503 and leaf springs 506 are, by way of example and illustration, but one means by which the motive force for the rotation of the interior cage 103 relative to the 1 U chassis 100 may be effected. Alternative examples may employ other means having equivalent structure, that perform the same function. Still other examples may use other lifts that do not have equivalent structure or that perform the same or similar function in a somewhat different way.

Still referring to FIG. 5, the lift 500 biases the interior cage 103 in the open position illustrated in FIG. 2 in this particular example, Thus, in this context, the lift 500 is, by way of example and illustration, but one means by which the interior cage 103 may be biased at least partially into the open position. Alternative examples may employ other means having equivalent structure that perform the same function. Furthermore, as stated above, still other examples may use other lifts that do not have equivalent structure or that perform the same or similar function in a somewhat different way.

Figure 6:
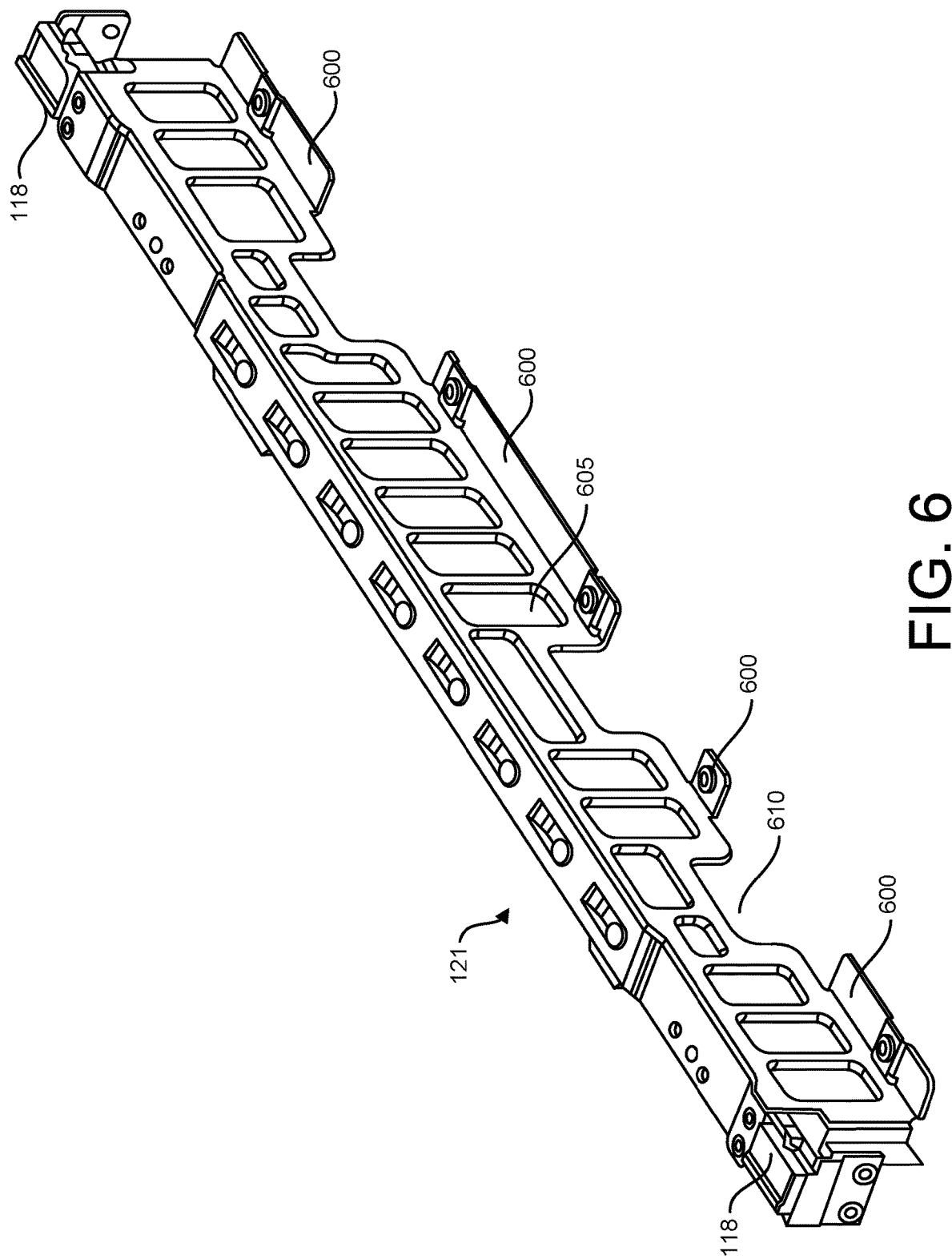
FIG. 6 depicts the latch bracket of the example in FIG. 1 disassembled from the 1 U chassis in a rear elevational view.

Referring again to FIG. 1 and FIG. 2 collectively, the 1 U chassis 100 further includes a pair of latching mechanisms 118. The latch mechanisms 118 are mounted to a latch bracket 121. The latch bracket 121 is better shown in FIG. 6 disassembled from the 1 U chassis 100. The latch bracket 121 includes a plurality of flanges 600 by which the latch bracket 121 is affixed to the interior floor (not shown) of the 1 U chassis 100. The affixation may be by, for example, fastening (such as by screws, brads, pins, etc.), adhering, bonding, etc.

The latch bracket 121 further includes a plurality of openings 605 (only one indicated) and notches 610 (only one indicated). The openings 605 permit access to ports and connectors (not shown) on the back of the storage media 110 when the storage media 110 are mounted in the interior cage 103 as shown in FIG. 2. The notches 610 permit cabling (not shown) to be run along the interior floor of the 1 U chassis 100 to other electronic components of the 1 U chassis 100. The number flanges 600, openings 605, and notches 610 will be implementation-specific for any given example.

Figure 7A:
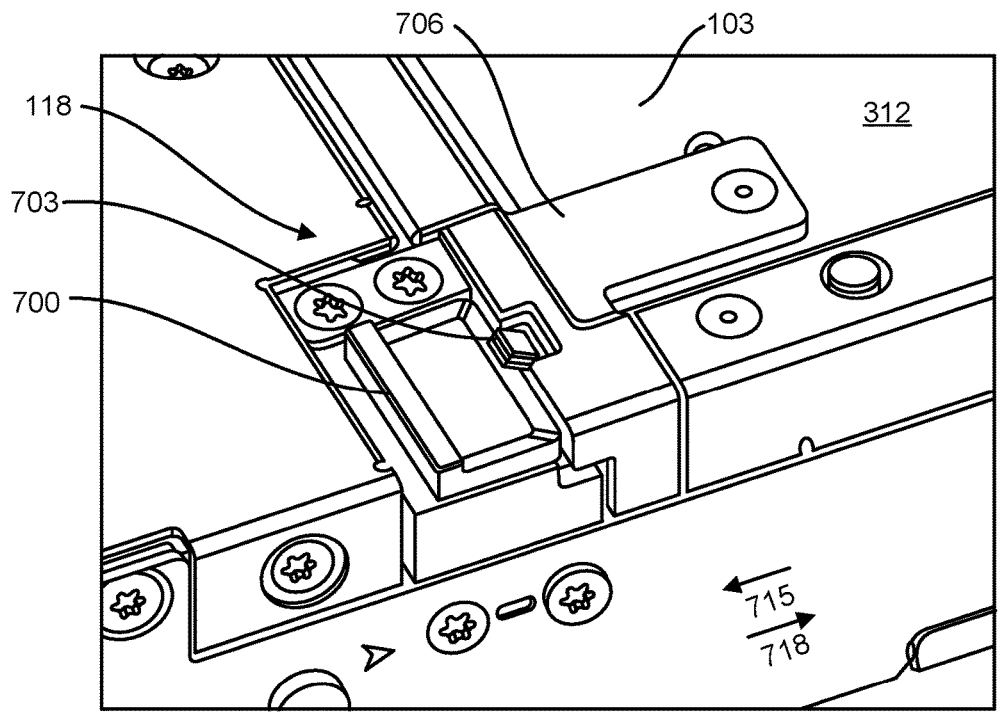
FIG. 7A and FIG. 7B depict the latching mechanism first shown in FIG. 1-FIG. 2 in greater detail when the interior cage is in the closed position in a top, elevational view and a side, partially sectioned view, respectively.
Figure 7B:
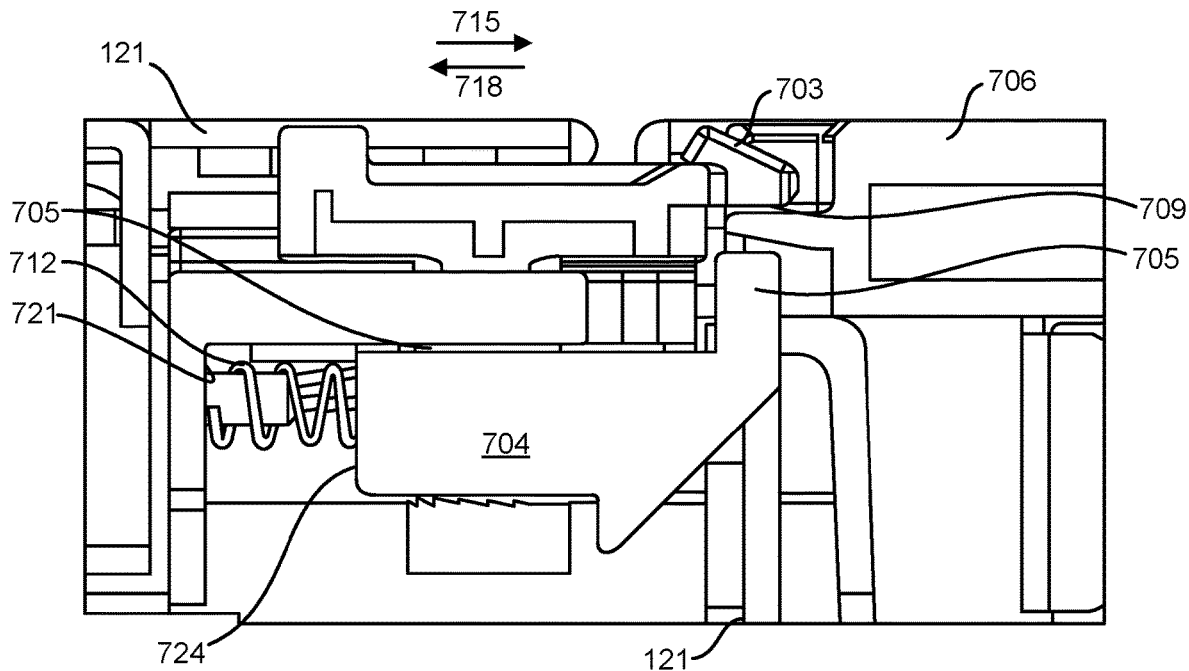

FIG. 7A-FIG. 7B depict the latching mechanism 118 first shown in FIG. 1-FIG. 2 when the interior cage 103 is in the closed position in greater detail. FIG. 7A is a top, elevational view and FIG. 7B is a side, partially sectioned view. The latching mechanism 118 as shown in FIG. 7A includes a first latching piece 700 defining a first tab 703. As shown in FIG. 7B, the latching mechanism 118 further includes a second latching piece 704 defining a post 705; a piece 706 affixed to the top cover 312 of the interior cage 103 and defining a landing 709; and a biasing means 712. The first latching piece 700 is shown in a first position. The first latching piece 700 translates in both a forward direction indicated by the arrow 715 to a second position and in a rearward direction indicated by the arrow 718 into the first position as described below.

More particularly, the biasing means 712 is, in this example, a coil spring. The coil spring is, by way of example and illustration, but one means by which the position of the first latching piece 700 may be biased into the first position. Alternative examples may employ other means having equivalent structure that perform the same function. Still other examples may use other biasing means that do not have equivalent structure or that perform the same or, similar function in a somewhat different way.

The biasing means 712 operates between a first face 721 of the latch bracket 121 and a second face 724 of the second latching piece 704 and operates to bias the first latching piece 700 toward the rearward direction 718. The first latching piece 700 and the second latching piece 704 engage each other through a post 725 of the first latching piece 700. Through this engagement, force imparted to the first latching piece 700 is transmitted to the second latching piece 704 and vice-versa.

When the interior cage 103 is rotated into the closed position shown in FIG. 1, the first tab 703 of the first latching piece 700 rests in the landing 709 of the piece 706. This is the "first position" for the latching mechanisms 118. In the first position, the latching mechanisms 118 restrain the operation of the lift 500, shown in FIG. 5, which is biased to rotate the interior cage 103 into the open position shown in FIG. 1 as discussed above. The latching mechanisms 118 thereby hold the interior cage 103 in the closed position.

Figure 8A:
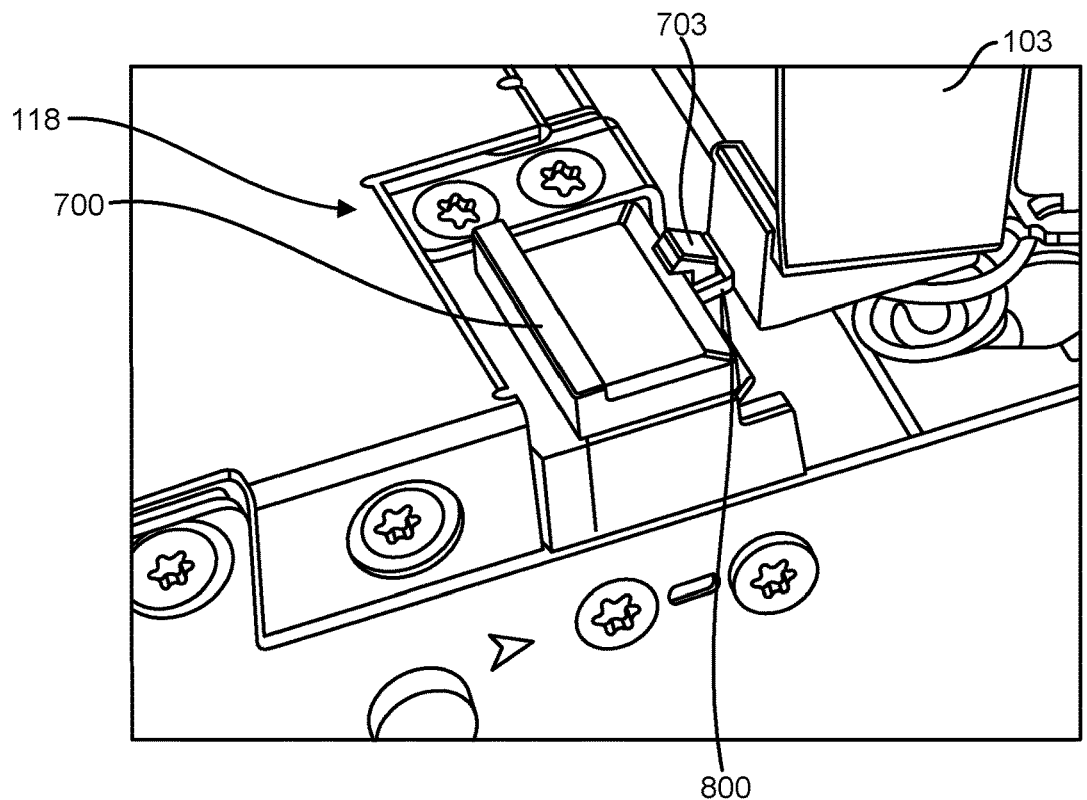
FIG. 8A and FIG. 8B depict the latching mechanism first shown in FIG. 1-FIG. 2 in greater detail when the interior cage is in the open position in a top, elevational view and a side, partially sectioned view, respectively.
Figure 8B:
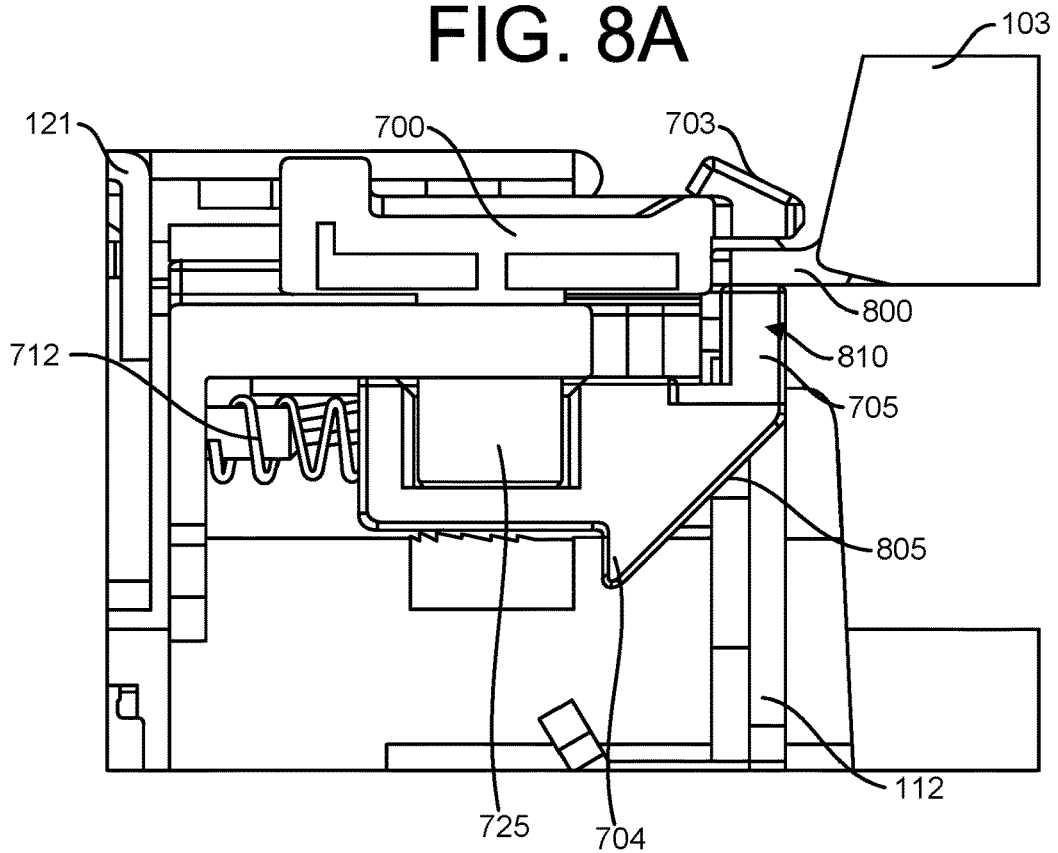
Figure 9:
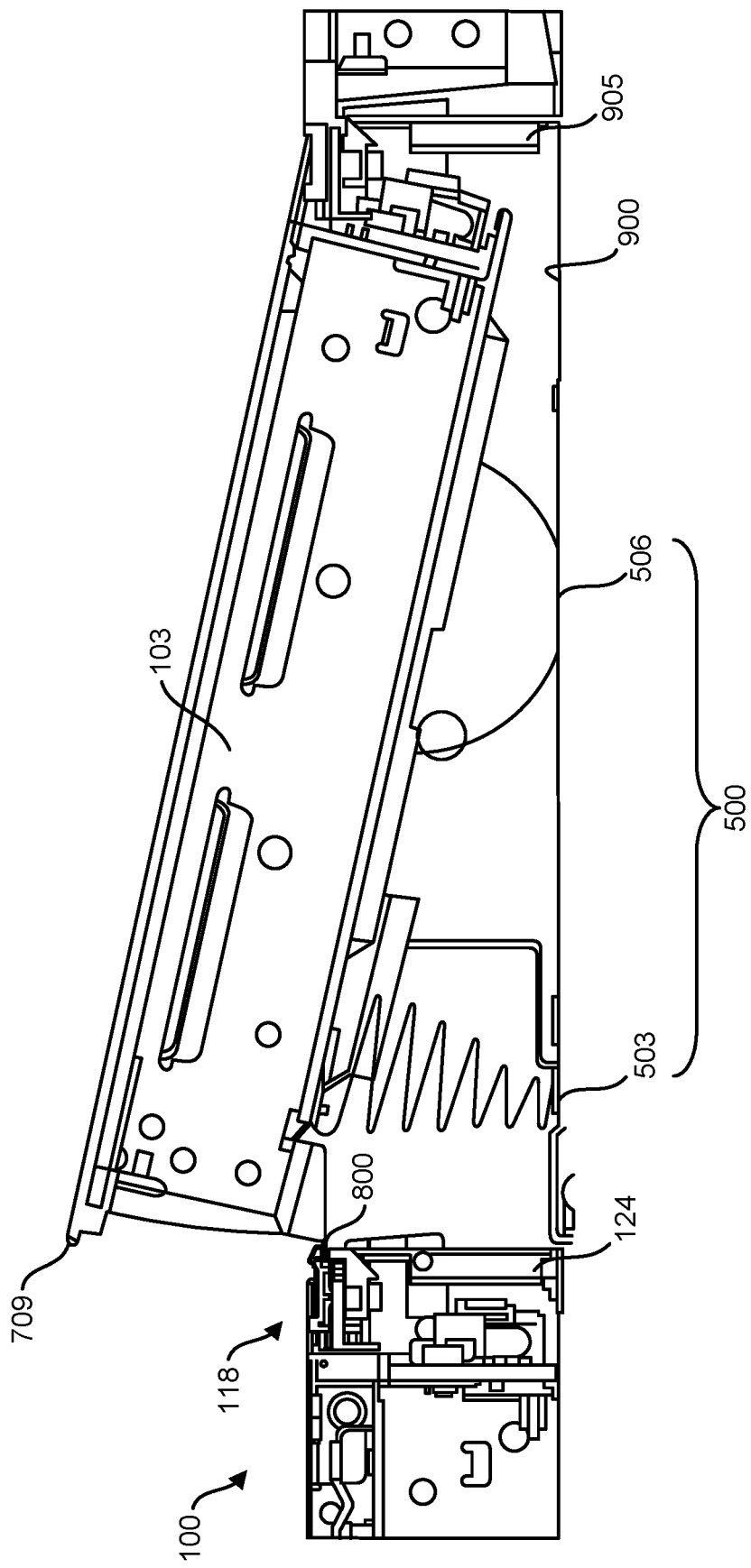
FIG. 9 is a partially sectioned, side view of the interior cage, latch bracket, and a latching mechanism of the example of FIG. 1 with the interior cage rotated into an open position.

FIG. 8A-FIG. 8B depict the latching mechanism 118 when the interior cage 103 is in the open position in greater detail. Figure 8A is a top, elevational view and FIG. 8B is a side, partially sectioned view. In FIG. 8A-FIG. 8B, the interior cage 103 has been rotated into the open position as is best shown in FIG. 2 and FIG. 9. Note that FIG. 9 shows the interaction between the coil springs 503 and the leaf springs 506 with the interior floor 900 of the 1 U chassis 100. FIG. 9 also shows the latch bracket 121 affixed to the interior floor 900 of the 1 U chassis 100. As shown in FIG. 8A-FIG. 8B, as the interior cage 103 opens a tab 800 projecting from the interior cage 103 contacts the first tab 703 that constrains the ability of the interior cage 103 to continue rotating responsive to the lift 500.

Referring now to FIG. 8B, when the first latching piece 700 is urged in the forward direction 715 toward its second position, the first tab 703 retracts from the landing 709. This releases the interior cage 103 to rotate at least partially into the open position shown in FIG. 2 and FIG. 9. In this example, the lift 500, shown in FIG. 5 and FIG. 9, rotates the interior cage 103 fully into the open position. The second latching piece 704 moves in the forward direction 715 with the first latching piece 700 by virtue of the engagement through the post 725.

As the interior cage 103 begins its rotation, the first latching piece 700 may be released. The biasing means 712 will then urge the first latching piece 700 to return to its first position as discussed above. This movement will carry with it the second latching piece 704 in the rearward direction 718. As the interior cage 103 continues its upward rotation, the tab 800 will contact the inclined face 805 of the second latching piece 704. The force exerted by the lift 500 against the inclined face 805 through the tab 800 overcomes the force of the biasing means 712 drives the first latching piece 700 and the second latching piece 704 back in the forward direction 715.

As the interior cage 103 continues the upward rotation, the tab 800 will traverse the vertical face 810 of the second latching piece. Once the tab 800 rises above the vertical face 810, the first latching piece 700 and the second latching piece return to the first position responsive to the urging of the biasing means 712. This is the point of operation illustrated in FIG. 8A-FIG. 8B. At this point, the first tab 703 constrains the rotation of the interior cage 103 while the post 705 locks the interior cage in the open position.

Thus, in operation, the interior cage 103 is installed in the 1 U chassis 100 in a closed position as shown in FIG. 1. The latching mechanism 118 is installed on the latch bracket 121 as best shown in FIG. 5. At this time, as shown in FIG. 7A-FIG. 7B, the first tab 703 of the first latching piece 700 is biased to its first position so that the first tab 703 rests in the landing 709 to constrain the rotation of the interior cage 103 responsive to the biasing of the lift 500. To open the interior cage 103, force may be applied to the first latching piece 700 to overcome the biasing means 712 so that the first latching piece 700 moves in a forward direction 715. This movement removes the first tab 703 from the landing 709, thereby removing the constraint on the biasing provided by the lift 500 and permitting the interior cage 103 to at least partially rotate open as best shown in FIG. 2 and FIG. 9.

Once the interior cage 103 begins its rotation, the force applied to the first latching piece 700 may be released. The biasing means 712 will then return the first latching piece 700 to its first position. The tab 800 on the interior cage 103 pushes the second latching piece 704 in a forward direction as described above until the second latching piece 704 and the first latching piece 700 are permitted to return to the first position. This permits the first tab 703 of the first latching piece 700 to engage the tab 800 on the bottom of the interior cage 103 and prevent further rotation responsive to the lift 500. This also permits the post 705 to constrain any downward rotation of the interior cage 103 to lock it into the open position.

To return the interior cage 103 to the closed position, force may be applied to the top of the interior cage 103 to overcome the bias of the lift 500 while the first latch piece 700 is urged once again in the forward direction 715. This will cause the interior cage 103 to rotate downward. The downward force may be applied until the interior cage 103 seats and the first latching piece 700 re-engages the interior cage 103 as shown in FIG. 7A-FIG. 7B.

Note that in FIG. 9 that the partition to which the interior cage 103 is, connected by a hinge is a second latch bracket 905. This is useful in examples where the interior cage 103 might be or is deployed with other interior cages 103. Some such examples are discussed below. However, in some examples the partition may be a wall, bulkhead, or bracket installed solely for the purpose of providing a partition to which the interior cage 103 may be rotatably mounted.

As mentioned, above, some examples may employ a lift differing from the lift 500, shown in FIG. 5, of the example discussed above relative to FIG. 1-FIG. 9. A second lift 1000 is illustrated in FIG. 10-FIG. 16, collectively. The second lift 1000 is shown in the context of an interior cage 1005 and a latch bracket 1010. The second lift 1000, interior cage 1005, and latch bracket 1010 are also shown disassembled from any 1 U chassis for the sake of clarity.

Figure 10:
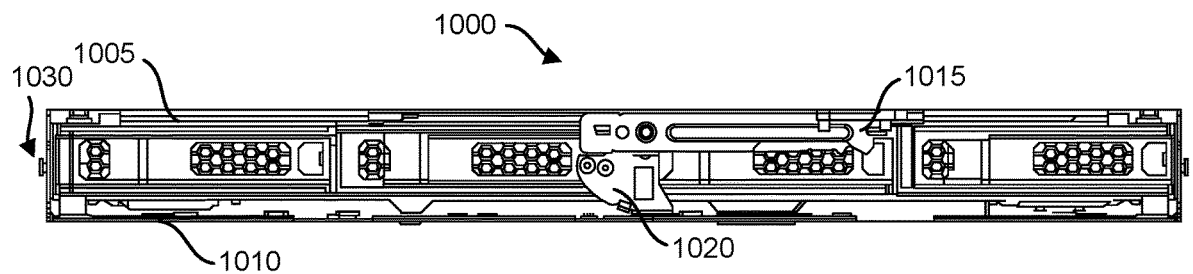
FIG. 10 depicts a second lift in a closed position in one example of the subject matter claimed below.
Figure 11:
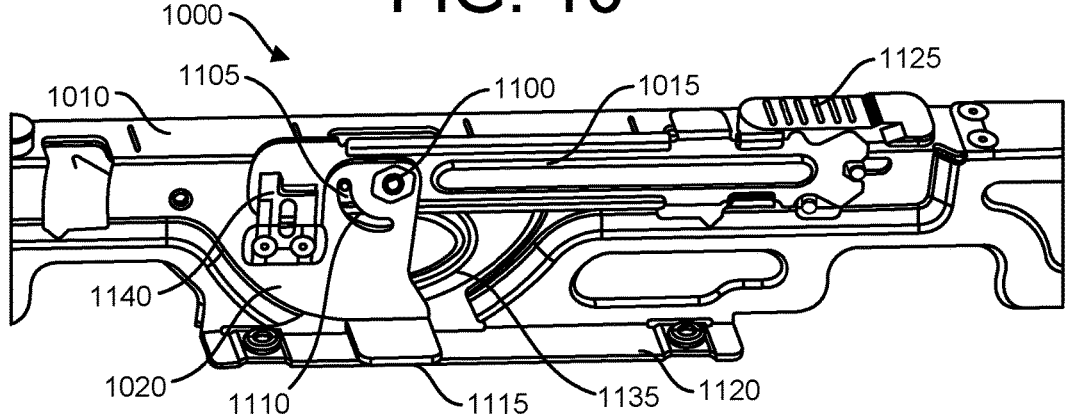
FIG. 11 is a section of FIG. 10 depicting the second lift in the closed position, in greater detail.

Referring to FIG. 10-FIG. 17 collectively, but as best shown in FIG. 11, the second lift 1000 includes a lever 1015 and cam 1020. When the lever 1015 is moved from a first position to a second position, the lever 1015 interacts with the cam 1020 to rotate the interior cage 1005 from a closed position shown in FIG. 10 to, an open position shown in FIG. 13. In this example, the second position is achieved by rotating the lever 1015 180° upward and over from the first position. When the lever 1015 is moved from the second position to the first position, it again interacts with the cam 1020 to rotate the interior cage 1005 back to the closed position in FIG. 10.

Figure 12:
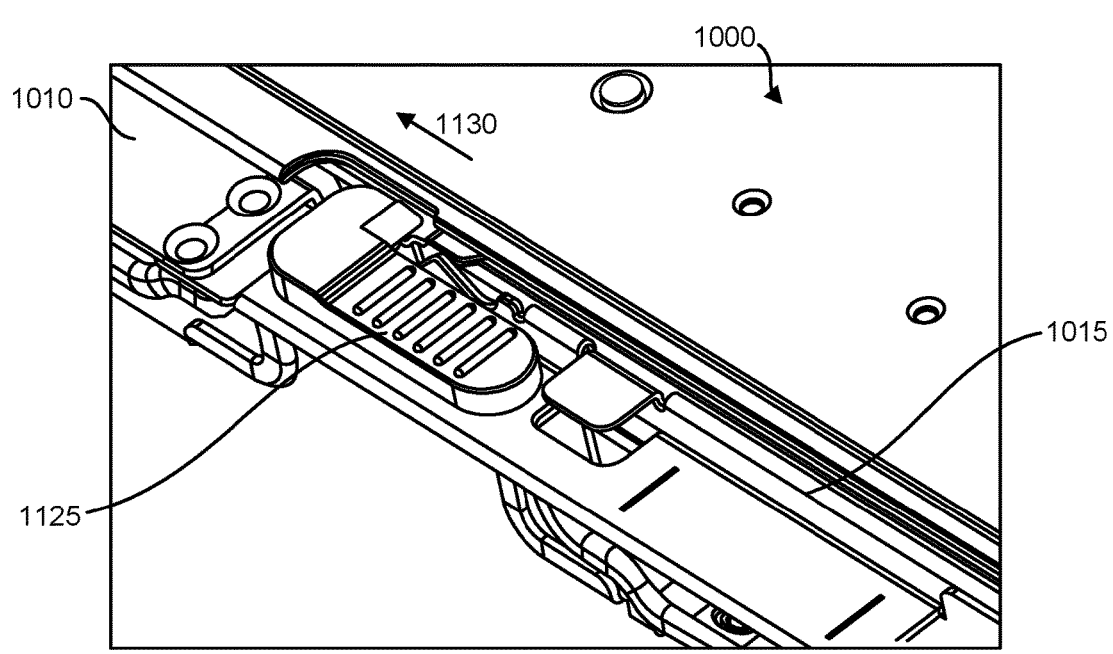
FIG. 12 is a top, elevational view of the second lift shown in the closed position and illustrating a first latch.

The second lift 1000 is best shown in the first position in FIG. 11-FIG. 12. Both the lever 1015 and the cam 1020 area rotatably mounted to the latch bracket 1010 by a pin 1100 about which they both rotate. In this example, the lever 1015 and the cam 1020 are both mounted on the same side of the latch bracket 1010. However, some examples may mount the lever 1015 and the cam 1020 on opposite sides of the latch bracket 1010 with some slight modifications to the details presented herein. In the example of FIG. 11-FIG. 15, the lever 1015 and cam 1020 are installed in the space at the front of the interior cage 1005 and the latch bracket 1010 as best shown in FIG. 12.

Figure 13:
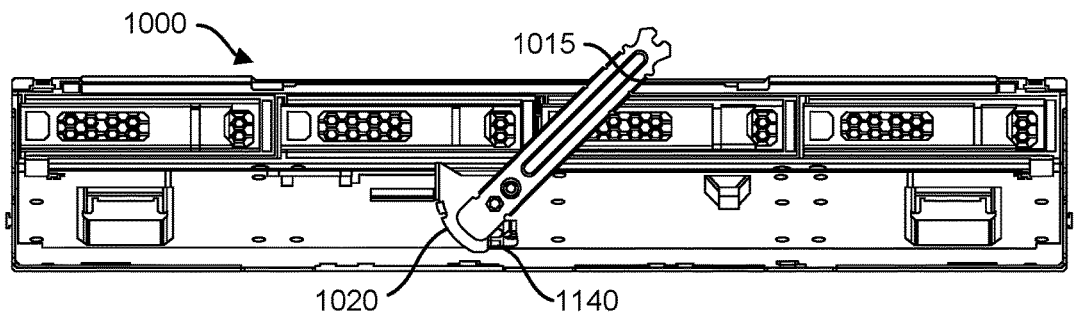
FIG. 13 depicts the second lift in a position intermediate the closed position of FIG. 10 and an open position.
Figure 14:
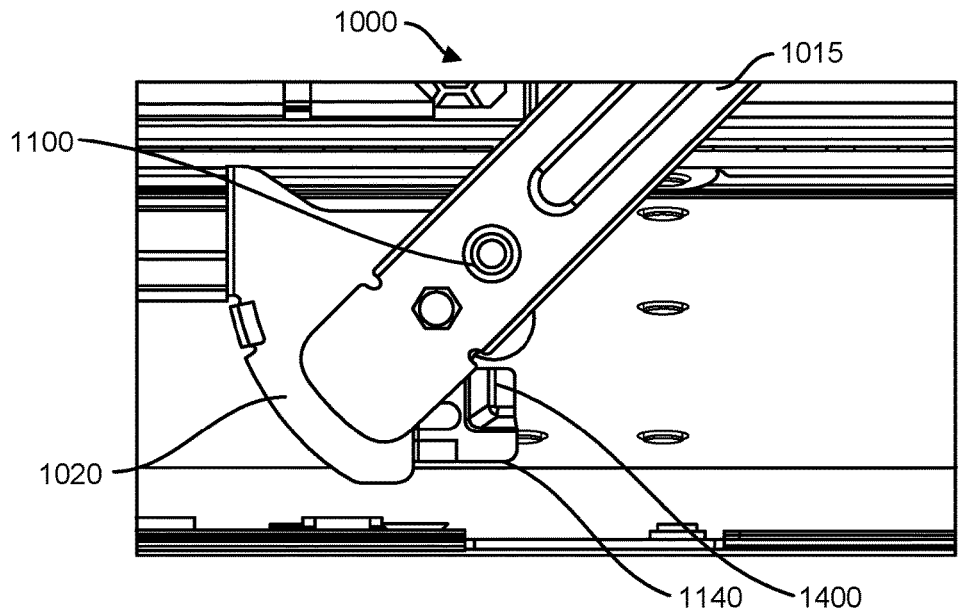
FIG. 14 is a section of FIG. 10 illustrating a portion of the second lift in the intermediate position.

As best shown in FIG. 11 and FIG. 14, the lever 1015 includes a pin 1105 that moves through a guide slot 1110 in the cam 1020 to drive the cam 1020. The pin 1105 moves through the guide slot 1110 from one end, of the guide slot 1110 as shown in FIG. 11 to the other end as shown in FIG. 16. As the lever 1015 is rotated, another pin (not shown) on the backside of the cam 1020 travels though the guide slot 1135 to transfer the rotation from the cam 1020 to the interior cage 1005. This driving movement occurs as the lever 1015 is moved from the first position in FIG. 10-FIG. 11, through the intermediate positions shown in FIG. 13 and FIG. 15 to the second position.

The cam 1020 includes a foot 1115. The foot 1115 mechanically engages the interior cage 1005 as the lever 1015 is moved from the first position to the second position to rotate the interior cage 1005 to the open position. Then, as the lever 1015 is moved back to the first position, the foot 1115 permits the interior cage 1005 to lower to responsive to the force of gravity. Eventually, the foot 1115 returns to its original position shown in FIG. 11.

Figure 15:
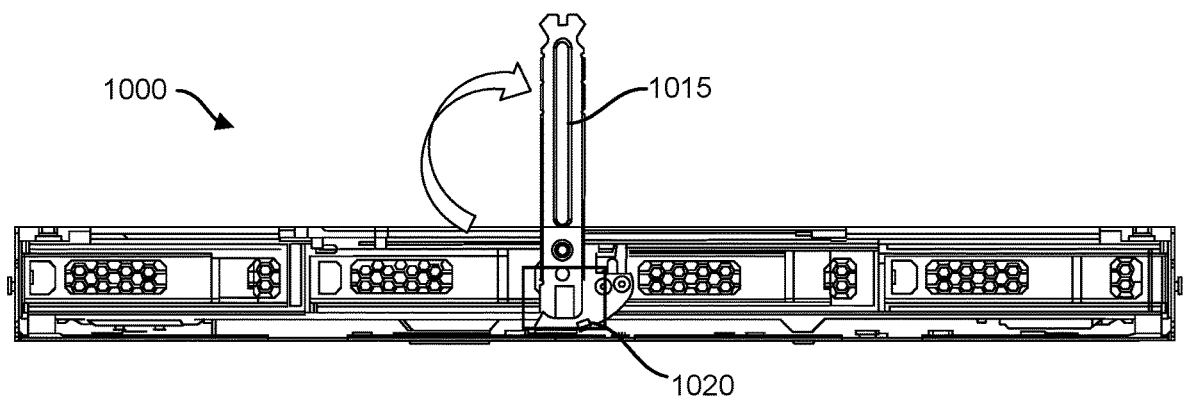
FIG. 15 depicts the second lift in an open position in one example of the subject matter claimed below.
Figure 16:
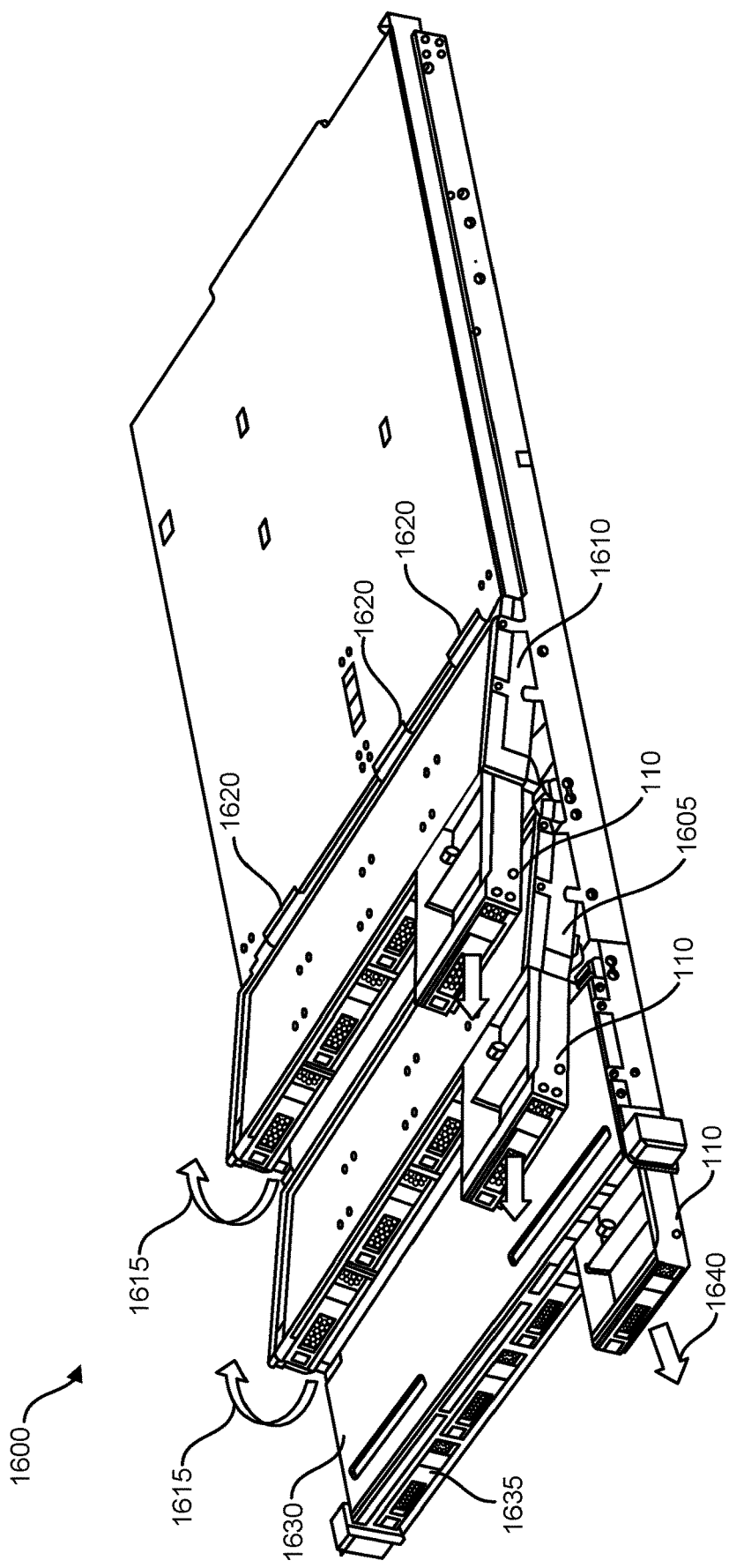
FIG. 16 depicts a 1 U chassis including installed cages in which two interior cages are rotated into an open position in an elevational view of one example of the subject matter claimed below.

As the lever 1015 is raised from the first position shown in FIG. 10 to the intermediate position shown in FIG. 15 and eventually to the second position, the cam 1020 rotates in a clockwise direction. This raises the foot 1115 as described above and raises the interior cage 1005 into the open position as shown in FIG. 13. The interior cage 1005 then returns to the closed position shown in FIG. 10 as the cam 1020 rotates in the counterclockwise direction and the foot 1115 retraces its path to its original position.

The second lift 1000 includes a thumb latch 1125 best shown in FIG. 11-FIG. 12. The thumb latch 1125 restrains the upward movement of the lever 1015 when in the position shown in FIG. 11-FIG. 12. The thumb latch 1125 may be moved in the direction of the arrow 1130. The direction 1130 is to one side of the chassis (not otherwise shown) and, thus, transverse to the axis from front to back of the interior cage 1005. Moving the thumb latch 1125 in the direction 1130 releases the lever 1015 and permits access thereto. Once released, the lever 1015 may then be raised as described above to rotate the interior cage 1005 into the open position.

The cam 1020 also includes a portion 1140 defining a tab 1400, shown in FIG. 14, on the side thereof facing the latch bracket 1010. As the lever 1015 is raised, the tab 1400 pops into an opening in the latch bracket 1010 as shown in FIG. 14. (The opening in the latch bracket 1010 is obscured by the tab 1400 in FIG. 14.) This locks the lever 1015 into the second position and, hence, the interior cage 1005 into the open position. As the lever 1015 is lowered to the first position, the lever 1015 pries the tab 1400 from the opening to further permit downward rotation to the first position.

Figure 17:
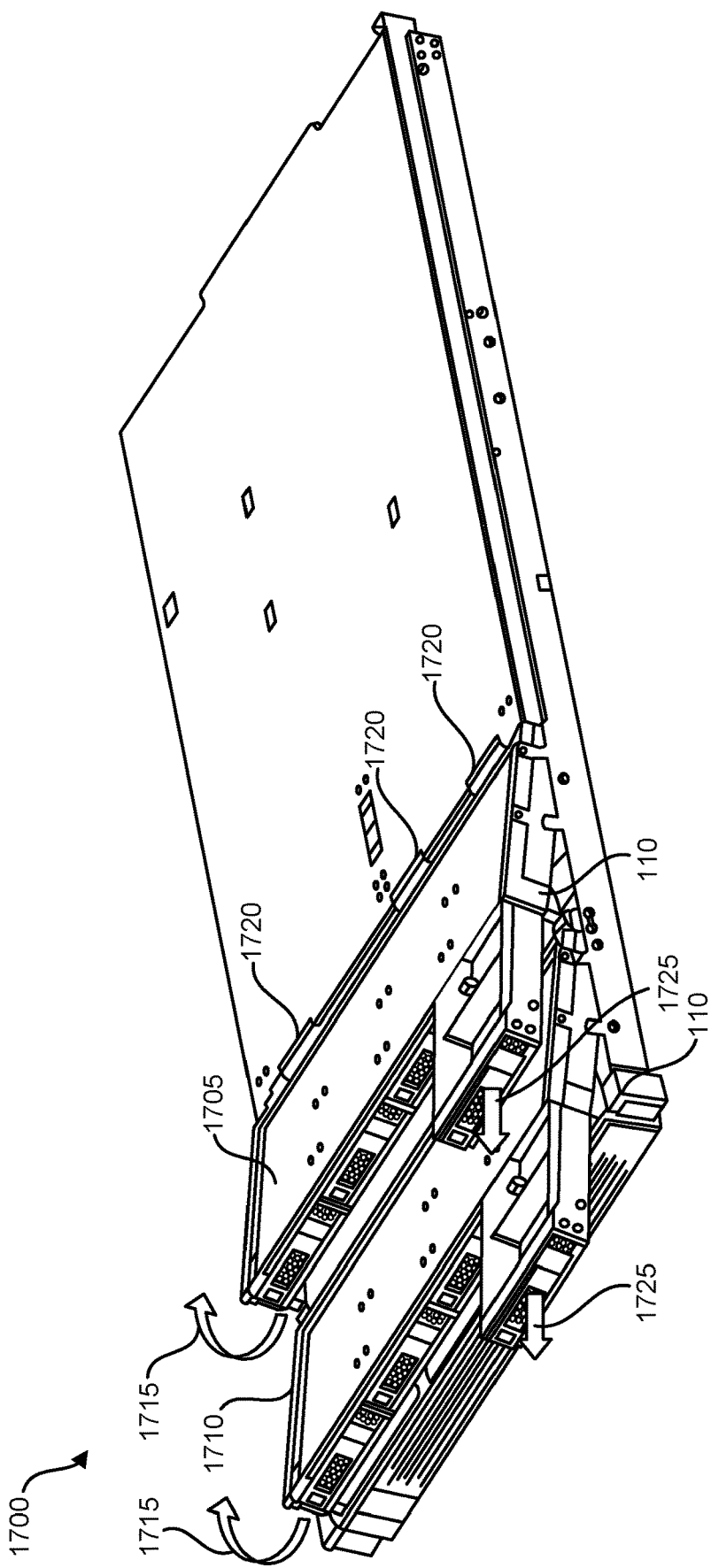
FIG. 17 depicts a 1 U chassis including installed cages in which an interior cage and an edge cage are rotated into an open position in an elevational view of one example of the subject matter claimed below.
Figure 18:
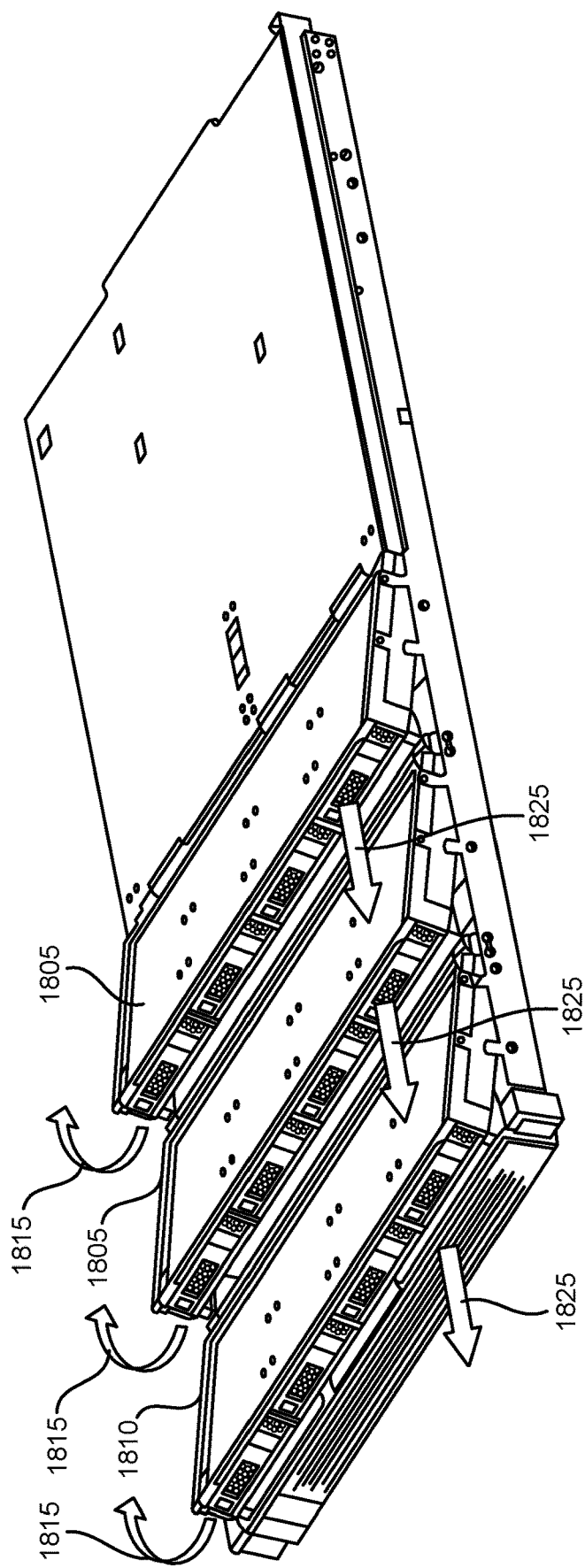
FIG. 18 depicts a 1 U chassis including installed cages in which two interior cages and an edge cage are rotated into an open position in, an elevational view of one example of the subject matter claimed below.

FIG. 16-FIG. 18 depict examples including variations on the examples discussed above. FIG. 16 depicts a 1 U chassis 1600 including installed cages in which two interior cages 1605, 1610 are rotated into an open position in an elevational view of one example of the subject matter claimed below. More particularly, both of the interior cages 1605, 1610 are installed in the 1 U chassis 1600 and operate in the same manner as the interior cage 103 relative to the 1 U chassis 100 in FIG. 1-FIG. 2. This similarity in installation and operation includes rotating, latching, and lifting.

The interior cages 1605, 1610 rotate into the open position shown as indicated by the arrows 1615. The rotation occurs about the hinges 1620, some of which are obscured from view, in the same manner as described above for the interior cage 103 in FIG. 1-FIG. 2. Storage media 110 can then be accessed and/or removed as indicated by the arrows 1625. Storage media 110 may be removed from the end compartment, which is obscured by the cover 1630 through the face 1635 as indicated by the arrow 1640.

FIG. 17 depicts a 1 U chassis 1700 including installed cages in which an interior cage 1705 and an edge cage 1710 are rotated into an open position in an elevational view of one example of the subject matter claimed below. More particularly, both of the interior cage 1705 and the edge cage 1710 are installed in the 1 U chassis 1700 and operate in the same manner as the interior cage 103 relative to the 1 U chassis 100 in FIG. 1-FIG. 2. This similarity in installation and operation includes rotating, latching, and lifting.

The interior cage 1705 and edge cage 1710 rotate into the open position shown as indicated by the arrows 1715. The rotation occurs about the hinges 1720, some of which are obscured from view, in the same manner as described above for the interior cage 1705 in FIG. 1-FIG. 2. Storage media 110 can then be accessed and/or removed as indicated by the arrows 1725 from both the interior cage 1705 and edge cage 1710.

FIG. 18 depicts a 1 U chassis 1800 including installed cages in which two interior cages 1805 and an edge cage 1810 are rotated into an open, position in an elevational view of one example of the subject matter claimed below. More particularly, both of the interior cages 1805 and the edge cage 1810 are installed in the 1 U chassis 1800 and operate in the same manner as the interior cage 103 relative to the 1 U chassis 100 in FIG. 1-FIG. 2. This similarity in installation and operation includes rotating, latching, and lifting.

The interior cages 1805 and edge cage 1810 rotate into the open position shown as indicated by the arrows 1815. The rotation occurs about the hinges 1820, some of which are obscured from view, in the same manner as described above for the interior cage 103 in FIG. 1-FIG. 2. Storage media 110 can then be accessed and/or removed as indicated by the arrows 1825.

Returning to FIG. 1 and FIG. 2, the interior cage 103 may be either a large form factor ("LFF") drive cage or a small form factor ("SFF") drive cage modified as described herein. The interior cage 103 is a large form factor drive cage in the examples illustrated herein. As such, the interior cage 103 mounts four storage media 110 installed in a horizontal row of four pockets. An interior drive cage that is a SFF drive cage would house 10 storage media 110 mounted in a horizontal row of five stacked pairs. However, the lifting, latching, and hinging mechanisms for examples with the SFF drive cage may be implemented the in the same manner as for the examples disclosed above using LFF drive cages.

In the examples discussed above, the storage media—e.g., the storage media 110 in FIG. 2—may be either spinning media or solid-state media. So, in various examples, the storage media may be, for instance, hard disk drives ("HDDs"), solid-state drives ("SSDs"), or some combination of the two. Still other examples may use still other types of storage media.

This concludes the detailed description. The particular examples disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed is:

1. An apparatus, comprising:
    a 1 U drive chassis divided into a plurality of compartments by a partition, the plurality of compartments including an interior compartment;
    an interior cage installed in the interior compartment, the interior cage including a plurality of pockets into which storage media are mounted when in use and having a back edge;
    a hinge by which the interior cage is rotatably mounted to the 1 U drive chassis along the back edge of the interior cage;
    a lift to rotate the interior cage at least partially to an open position, wherein the lift includes a biasing member to bias the interior cage to a partially open or open position; and
    a latch mounted to a latch bracket, the latch including:
        a first latch piece defining a first tab;
        a second latch piece defining a post;
        a biasing means operating between a first face of the latch bracket and a second face of the second latch piece; and
        the second latch piece being mechanically engaged with a second tab protruding from the interior cage as the interior cage rotates in an upwards direction, wherein a contact between the second tab and the first tab constrains the interior cage in the open position and from continuing to rotate responsive to operation of the biasing member, and wherein the post constrains any downward rotation of the interior cage in the open position.

2. The apparatus of claim 1, wherein:
    the plurality of compartments further includes an edge compartment; and further comprising:
        an edge cage installed in the edge compartment, the edge cage including a first plurality of pockets into which a plurality of the storage media are mounted when in use and having a second back edge.

3. The apparatus of claim 2, further comprising:
    a second hinge, wherein the edge cage is rotatably mounted to a second partition at the second back edge thereof by the second hinge.

4. The apparatus of claim 1, wherein the hinge is a leaf hinge, the leaf hinge further comprising:
    a first leaf affixed to the back edge of the interior cage;
    a second leaf affixed to the partition; and
    a pivot between the first leaf and the second leaf around which the first leaf and the interior cage are to rotate into the open position.

5. The apparatus of claim 1, wherein the interior cage is mounted to the 1 U drive chassis on the partition.

6. The apparatus of claim 1, wherein the latch further includes:
    a piece affixed to a top of the interior cage and defining a landing,
    the first latch piece being biased in a first direction and the first tab retracting from the landing and releasing the interior cage to rotate in the upwards direction into the open position responsive to the operation of the biasing member when the bias in the first direction is overcome.

7. A method for installing a device cage in a 1 U chassis, comprising:
    partitioning a 1 U chassis into a plurality of compartments, the plurality of compartments including an interior compartment;
    installing an interior cage in the interior compartment, the interior cage being rotatably mounted to a partition by a hinge and latched into a closed position;
    releasing a latch to permit upward rotation of the interior cage, wherein the latch is mounted to a latch bracket and includes:
        a first latch piece defining a first tab;
        a second latch piece defining a post;
        a biasing means operating between a first face of the latch bracket and a second face of the second latch piece; and the second latch piece being mechanically engaged with a second tab protruding from the interior cage as the interior cage rotates in an upwards direction, wherein a contact between the second tab and the first tab constrains the interior cage in the open position and from continuing to rotate responsive to operation of the biasing member, and wherein the post constrains any downward rotation of the interior cage in the open position;

rotating the interior cage to an open position sing a lift which includes a biasing member to bias the interior cage to a partially open or open position; and latching the interior cage in the open position.

8. The method of claim 7, further comprising:
accessing storage media while the interior cage is rotated into the open position; and
rotating the interior cage to a closed position.

9. The method of claim 7, wherein the releasing the latch includes moving a first latch piece in a forward direction or a rearward direction.

10. The method of claim 9, wherein rotating the interior cage to the open position includes permitting the lift to rotate the interior cage upon releasing the latch, the first latch piece being biased in a first direction and the first tab retracting from the landing and releasing the interior cage to rotate in the upwards direction into the open position responsive to the operation of the biasing member when the bias in the first direction is overcome.

11. The method of claim 7, wherein releasing the latch includes moving a thumb latch in a first direction transverse to a forward direction or a rearward direction.

12. An apparatus, comprising:
a 1 U drive chassis divided into a plurality of compartments by a partition, the plurality of compartments including an interior compartment;
an interior cage installed in the interior compartment, the interior cage including a plurality of pockets into which storage media are mounted when in use and having a back edge;
means for rotating the interior cage relative to the 1 U drive chassis along the back edge of the interior cage;
means for lifting the interior cage to rotate the interior cage at least partially to an open position, wherein the lift includes a biasing member to bias the interior cage to a partially open or open position; and
means for latching the interior cage in a closed position and in the open position according to the rotation of the interior compartment, wherein the means for latching the interior cage includes a latch mounted to a latch bracket, the latch including:
a first latch piece defining a first tab;
a second latch piece defining a post;
a biasing means operating between a first face of the latch bracket and a second face of the second latch piece; and
the second latch piece being mechanically engaged with a second tab protruding from the interior cage as the interior cage rotates in an upwards direction, wherein a contact between the second tab and the first tab constrains the interior cage in the open position and from continuing to rotate responsive to operation of the biasing member, and wherein the post constrains any downward rotation of the interior cage in the open position.

13. The apparatus of claim 12, wherein:
the plurality of compartments further includes an edge compartment; and further comprising:
an edge cage rotatably installed in the edge compartment, the edge cage including a first plurality of pockets into which a plurality of the storage media are mounted when in use and having a second back edge.

14. The apparatus of claim 12, wherein the rotating means is a hinge.

15. The apparatus of claim 12, wherein the latch further includes
a piece affixed to a top of the interior cage and defining a landing, the first latch piece being biased in a first direction and the first tab retracting from the landing and releasing the interior cage to rotate in the upwards direction into the open position responsive to the operation of the biasing member when the bias in the first direction is overcome.

* * * * *